United States Patent
Tian et al.

(10) Patent No.: US 11,327,401 B2
(45) Date of Patent: May 10, 2022

(54) DISPLAY SUBSTRATE, METHOD FOR PREPARING THE SAME, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Jian Tian, Beijing (CN); Zouming Xu, Beijing (CN); Lei Zhang, Beijing (CN); Yaying Li, Beijing (CN); Chunjian Liu, Beijing (CN); Qitao Zheng, Beijing (CN); Xianlin Ding, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 342 days.

(21) Appl. No.: 16/427,772

(22) Filed: May 31, 2019

(65) Prior Publication Data
US 2020/0057374 A1    Feb. 20, 2020

(30) Foreign Application Priority Data
Aug. 17, 2018   (CN) .......................... 201810942756.6

(51) Int. Cl.
*G06F 3/041*   (2006.01)
*G03F 7/20*    (2006.01)
(Continued)

(52) U.S. Cl.
CPC .......... *G03F 7/2016* (2013.01); *G03F 7/0041* (2013.01); *G06F 3/0412* (2013.01); *G06F 3/04164* (2019.05); *H01L 27/323* (2013.01)

(58) Field of Classification Search
None
See application file for complete search history.

(56) References Cited

U.S. PATENT DOCUMENTS

2005/0175907 A1   8/2005   Park
2009/0315859 A1*  12/2009  Chien ................... G06F 3/0445
                                                345/175
(Continued)

FOREIGN PATENT DOCUMENTS

| CN | 102981306 A | 3/2013 |
| CN | 104571757 A | 4/2015 |
| CN | 107369777 A | 11/2017 |

OTHER PUBLICATIONS

Mar. 16, 2020—(CN) First Office Action Appn 201810942756.6 with English Translation.

*Primary Examiner* — Brian M Butcher
(74) *Attorney, Agent, or Firm* — Banner & Witcoff, Ltd.

(57) ABSTRACT

A display substrate, a method for preparing the same and a display device are provided. The method for preparing the display substrate includes: providing a base substrate, in which the base substrate includes a first region and a second region; forming a first structure in the first region using a first mask and a first photoresist; forming a functional material layer at a side, which is away from the base substrate, of the first structure; and patterning the functional material layer using a second mask and the first mask to form a functional layer in the second region.

20 Claims, 11 Drawing Sheets

(51) Int. Cl.
    *G03F 7/004*    (2006.01)
    *H01L 27/32*    (2006.01)

(56) References Cited

U.S. PATENT DOCUMENTS

| | | | | |
|---|---|---|---|---|
| 2015/0338953 A1* | 11/2015 | Liu | ............... | H05K 7/02 |
| | | | | 345/174 |
| 2017/0177105 A1* | 6/2017 | Wu | ............... | H05K 3/10 |
| 2019/0067647 A1 | 2/2019 | Zhang et al. | | |

* cited by examiner

DISPLAY SUBSTRATE, METHOD FOR PREPARING THE SAME, AND DISPLAY DEVICE

CROSS-REFERENCE TO RELATED APPLICATIONS

The present application claims priority of Chinese Patent Application No. 201810942756.6 filed on Aug. 17, 2018, the disclosure of which is incorporated herein by reference in its entirety as part of the present application.

TECHNICAL FIELD

At least one embodiment of the present disclosure relates to a display substrate, a method for preparing the same, and a display device.

BACKGROUND

Requirements for a production process of existing touch products are becoming stricter due to an increasing requirement for touch precision. At present, touch products manufactured by lithography processes such as mask exposure and etching can meet performance requirements of some high-end products due to their high alignment precision between stacks and excellent manufacturing processes of each layer.

However, the above photolithography process requires that in a development process of each new product, a set of mask plates should be designed and customized for each layer. For products with a same overall size, even if the products have a same size of an AA (Active Area) area, positions of peripheral traces (for example, driving circuit traces) and a bonding region are different. In a case where the positions of the peripheral traces and the bonding region change, it is usually necessary to redesign and customize a new mask.

Due to a rapid replacement of touch products, product changes and the requirements of making patterns with a high alignment accuracy on a display substrate, such as touch electrode patterns, etc., have placed great pressure on production and development costs and a processing accuracy of touch product manufacturers.

SUMMARY

At least one embodiment of the present disclosure provides a method for preparing a display substrate, the method comprising: providing a base substrate, in which the base substrate comprises a first region and a second region; forming a first structure in the first region using a first mask and a first photoresist; forming a functional material layer at a side, which is away from the base substrate, of the first structure.

For example, the method of preparing the display substrate provided by at least one embodiment of the present disclosure includes forming a second photoresist at a side, which is away from the base substrate, of the functional material layer; performing first exposure on the second photoresist using the second mask; performing second exposure on the second photoresist using the first mask; developing the second photoresist after the first exposure and the second exposure to form a photoresist pattern; and performing an etching process on the functional material layer using the photoresist pattern to form the functional layer.

For example, the method of preparing the display substrate provided by at least one embodiment of the present disclosure includes forming a second photoresist at a side, which is away from the base substrate, of the functional material layer; performing a first patterning process on the functional material layer using the second mask and the second photoresist to form a pre-functional layer, wherein the pre-functional layer comprises a portion in the first region and a portion in the second region; forming a third photoresist at a side, which is away from the base substrate, of the pre-functional layer; and performing a second patterning process on the pre-functional layer using the first mask and the third photoresist to remove the portion of the pre-functional layer located in the first region and retain the portion of the pre-functional layer located in the second region as the functional layer.

For example, in the method of preparing the display substrate provided by at least one embodiment of the present disclosure, the portion of the pre-functional layer located in the first region is a circuit trace.

For example, in the method of preparing the display substrate provided by at least one embodiment of the present disclosure, the first photoresist is a negative photoresist and the second photoresist is a positive photoresist; alternatively, the first photoresist is a positive photoresist and the second photoresist is a negative photoresist.

For example, in the method of preparing the display substrate provided by at least one embodiment of the present disclosure, the display substrate is a touch substrate, the second region is a touch region, and the first region is a non-touch region located outside the touch region; the first structure is a black matrix located in the non-touch region.

For example, the method of preparing the display substrate provided by at least one embodiment of the present disclosure includes: forming a first touch electrode and a second touch electrode in the touch region, wherein the first touch electrode and the second touch electrode are in a same layer and insulated from each other, the first touch electrode extends in a first direction, the second touch electrode extends in a second direction and comprises two portions spaced apart from each other by the first touch electrode, forming a connection bridge electrically connecting the two portions of the second touch electrode; the functional layer is the connection bridge.

For example, in the method of preparing the display substrate provided by at least one embodiment of the present disclosure, the functional layer is a touch electrode.

For example, in the method of preparing the display substrate provided by at least one embodiment of the present disclosure, a material of the functional material layer is a metal material.

For example, the method of preparing the display substrate provided by at least one embodiment of the present disclosure further includes forming an insulating layer; the insulating layer is located between the connection bridge and the first touch electrode to insulate the connection bridge from the first touch electrode.

For example, the method of preparing the display substrate provided by at least one embodiment of the present disclosure further includes forming a protection layer covering the functional layer at a side, which is away from the base substrate, of the functional layer.

For example, in the method of preparing the display substrate provided by at least one embodiment of the present disclosure, the material of the protection layer includes at least one of organic material, silicon oxide, silicon nitride or silicon oxynitride.

For example, in the method of preparing the display substrate provided by at least one embodiment of the present disclosure, the forming of the protection layer covering the functional layer includes forming a photoresist material layer covering the base substrate at a side, which is away from the base substrate, of the functional layer; patterning the photoresist material layer using the first mask to form the protection layer.

For example, in the method of preparing the display substrate provided by at least one embodiment of the present disclosure, the first photoresist is a negative photoresist; the photoresist in the photoresist material layer is a positive photoresist; alternatively, the first photoresist is a positive photoresist; the photoresist in the photoresist material layer is a negative photoresist.

At least one embodiment of the present disclosure also provides a display substrate including a base substrate, a first structure and a functional layer. The base substrate includes a first region and a second region; the first structure is in the first region; the functional layer is in the second region; in the first region, no layer in a same layer with the functional layer or made of a same material as the functional layer is in the first region.

For example, in the display substrate provided by at least one embodiment of the present disclosure, the display substrate is a touch substrate, the second region is a touch region, and the first region is a non-touch region located outside the touch region; the first structure is a black matrix located in the non-touch region.

For example, the display substrate provided by at least one embodiment of the present disclosure further includes a first touch electrode, a second touch electrode, and a connection bridge. The first touch electrode and the second touch electrode are positioned in the touch region, the first touch electrode extends in a first direction, the second touch electrode extends in a second direction and comprises two portions spaced apart from each other by the first touch electrode; a connection bridge electrically connects the two portions of the second touch electrode; the functional layer is the connection bridge.

At least one embodiment of the present disclosure also provides a display device, and the display device includes any one of the display substrates provided by the embodiments of the present disclosure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
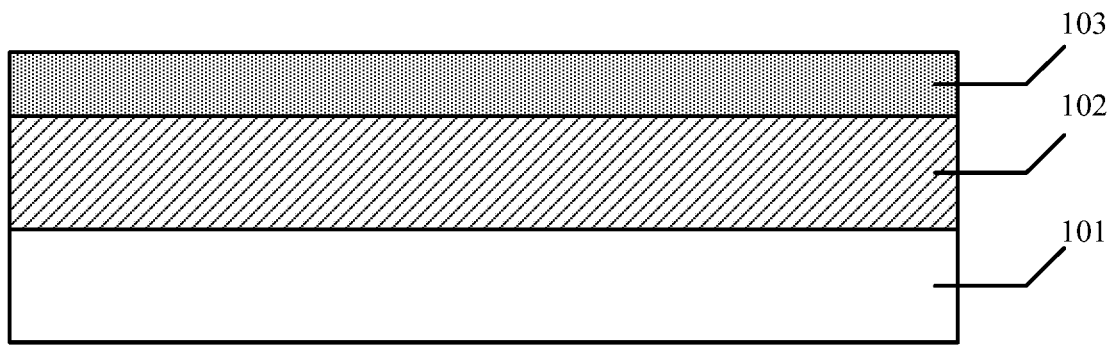
FIG. 1 to FIG. 4 are schematic diagrams of a preparation method of a metal layer.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The thickness of each component and the size and shape of the region in the drawings of the present disclosure do not reflect the true proportion of each component, and the purpose is only to schematically illustrate the content of the application.

It should be noted that the embodiments in this application and the features in the embodiments can be combined with each other without conflict.

For example, a conventional production process of a display substrate is as follows.

Step 1: manufacturing a BM (Black Matrix) layer.

Specifically, a layer of BM photoresist is coated on an entire surface of the base substrate, and a customized BM Mask (for example, mask plate) is used to expose the base substrate, and then a developing reaction is carried out to develop the BM photoresist in a non-photosensitive region, and then the BM photoresist is stripped.

In the above-mentioned process, a material of the BM photoresist is a negative photosensitive material, and a portion of the BM photoresist in a photosensitive region undergoes a chemical reaction and is difficult to remove so that it is used to form design patterns on the base substrate.

Step 2, manufacturing an ITO (Indium Tin Oxide) layer.

Specifically, an ITO layer is vapor-deposited on the entire surface of the base substrate, a photo resist (PR) is coated on a surface of the ITO layer; the photo resist is exposed by a customized ITO Mask, and then a development reaction is carried out, an unprotected portion of the ITO layer is etched by an etching liquid, and finally the PR which is not photosensitive is removed.

Step 3: manufacturing an Over Coating 1 (OC1) layer.

An OC1 connection bridge is formed by coating an OC glue (with photoresist properties), exposure using a customized OC1 Mask, and development.

Step 4: manufacturing a metal layer. For example, the metal layer includes peripheral traces located outside the touch region and connection bridges connecting touch electrodes.

Using a customized metal mask and a metal layer, metal peripheral traces and metal connection bridges are formed by sputtering, coating a positive PR, exposure, development, etching and photoresist removal.

FIG. 1 to FIG. 4 are schematic diagrams of a preparation method of the metal layer.

As illustrated in FIG. 1, a substrate 101 is provided, a metal material 102 is coated on the base substrate 101, and a photoresist 103 is coated on the metal material 102.

Figure 2:
Figure 2:
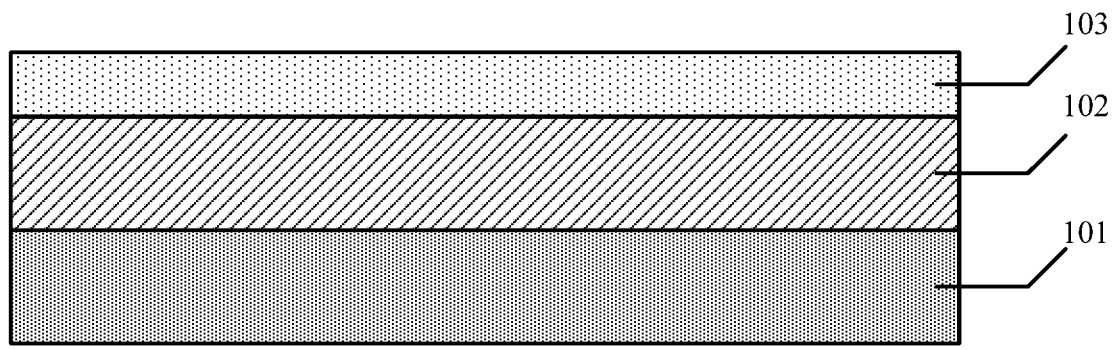

As illustrated in FIG. 2, a metal mask 104 is used to expose the photoresist 103.

Figure 3:
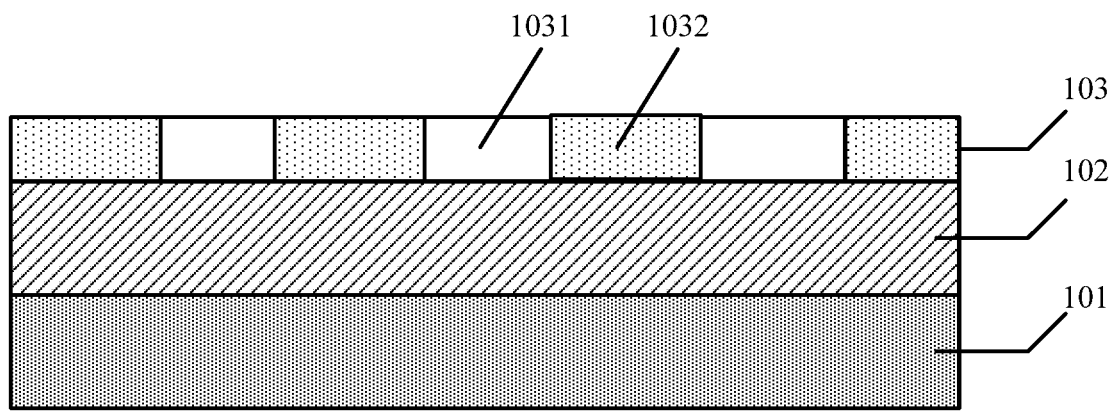

As illustrated in FIG. 3, a photosensitive region 1031 of the photoresist 103 and a non-photosensitive region 1032 of the photoresist 103 are obtained after an exposure treatment.

Figure 4:
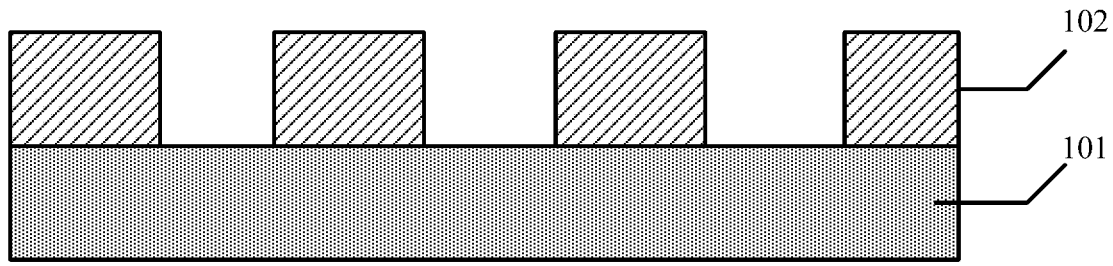

As illustrated in FIG. 4, the photoresist 103 after being exposed is developed to expose a part of the metal material 102, and the exposed part of the metal material 102 is etched to form a metal layer.

Step 5, manufacturing a SiNxOy (silicon oxynitride) layer.

Step 6: manufacturing an OC2 layer.

Using a customized OC2 Mask, the OC2 layer is formed by coating an OC glue (with photoresist properties), exposure and development.

The photoresist in the step 3 and the OC glue in the step 6 includes a negative photoresist.

According to the above processing flow, at least 5 masks are required to make the above structure in a development process of a display product such as a touch product. When a new product needs to be developed, even if a size of the AA area of the new product is same as that of an original product, but an arrangement of the peripheral traces and a location of the bonding region are different, it is still necessary to re-customize 5 masks for the changed arrangement of the peripheral traces and the location of the bonding region, which leads to a high production and development cost.

At least one embodiment of the present disclosure provides a method for preparing a display substrate, the method comprising: providing a base substrate, in which the base substrate comprises a first region and a second region; forming a first structure in the first region using a first mask and a first photoresist; forming a functional material layer at a side, which is away from the base substrate, of the first structure; and patterning the functional material layer using a second mask and the first mask to form a functional layer in the second region. The method for preparing the display substrate provided by at least one embodiment of the present disclosure can reduce the production and development cost by improving a utilization rate of the mask plate, and is beneficial to producing a touch substrate with a photolithographic high alignment precision touch region at a lower cost, and reduces a production difficulty of manufacturers.

Hereinafter, the method for preparing the display substrate provided by at least one embodiment of the present disclosure is described in detail with reference to the drawings and with reference to examples.

Figure 5:
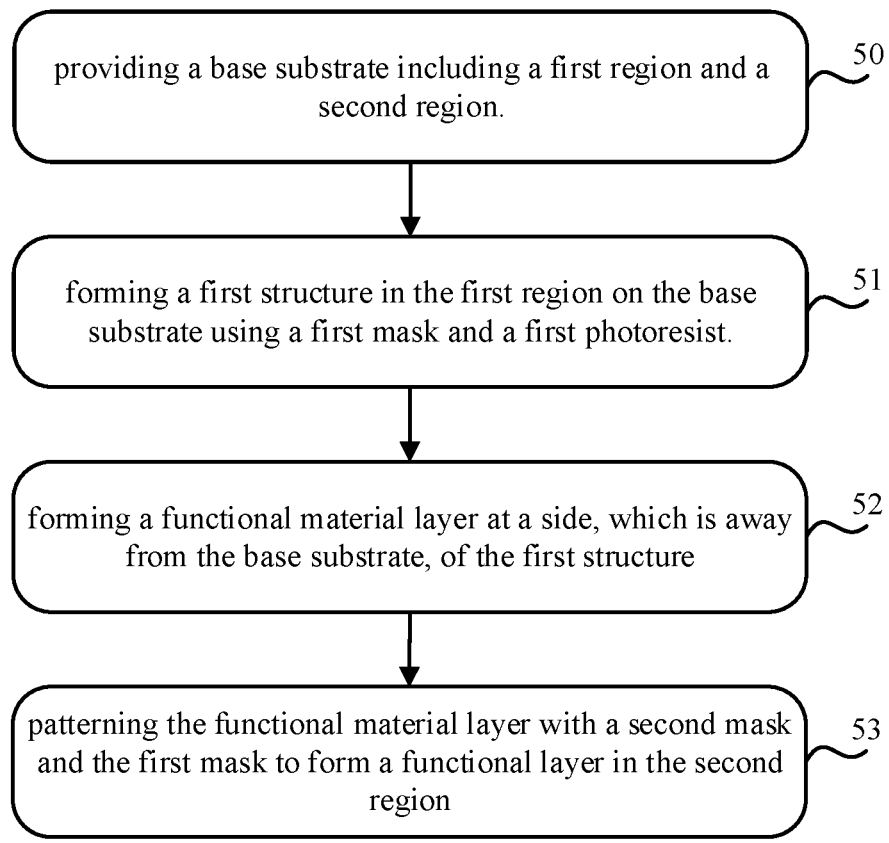
FIG. 5 is a flowchart of a method for preparing a display substrate provided by an embodiment of the disclosure.

FIG. 5 is a flowchart of a method for preparing a display substrate according to at least one embodiment of the present disclosure. As illustrated in FIG. 5, the method includes the following steps.

Step 50: providing a base substrate including a first region and a second region. For example, the first region and the second region are any two different regions on the base substrate that do not overlap each other. For example, the base substrate is a glass substrate, a plastic substrate, or the like.

Step 51: forming a first structure in the first region on the base substrate using a first mask and a first photoresist.

The first structure here is, for example, a black matrix, and the first mask is, for example, a mask for forming the black matrix (BM Mask).

Step 52: forming a functional material layer on a side, which is away from the base substrate, of the first structure.

Step 53: patterning the functional material layer with a second mask and the first mask to form a functional layer mask in the second region; the first mask is the mask for forming the first structure described above. The second mask is different from the first mask.

In the method for preparing the touch control substrate provided by at least one embodiment of the disclosure, the first mask is reused in the process of forming a plurality of functional layers, so that it is not necessary to design a special mask for patterning each of the functional layers, and therefore a mask cost is saved. Especially in a case where patterns of the plurality of functional layers are relatively complex and an alignment precision required in a photolithography process is high, for example, the alignment precision required in the photolithography process for the touch electrode is high, so that the cost can be greatly saved. In addition, when developing a new product, under a condition where a pattern of the functional layers in the first region needs to be changed without changing a pattern of the functional layers in the second region, and the accuracy of the pattern in the first region does not need to be as high as that in the second region, there is no need to design a special mask for forming the new pattern in the first region, only a mask for forming the pattern in the second region is needed, on this basis, subsequently, the pattern in the first region can be formed by methods such as screen printing and FPC (Flexible Printed Circuit board) routing, so as to not only save costs, but also reduce technical implementation difficulty of display substrate manufacturers when producing new products.

For example, in one embodiment, the method for preparing the display substrate includes forming a second photoresist at a side, which is away from the base substrate, of the functional material layer; performing a first exposure on the second photoresist using the second mask; performing a second exposure on the second photoresist using the first mask; developing the second photoresist after the first exposure and the second exposure to form a photoresist pattern; and performing an etching process on the functional material layer using the photoresist pattern to form the functional layer.

Illustratively, FIG. 6A-FIG. 6D, FIG. 7-FIG. 10, and FIG. 11A are schematic views of a method for preparing a display substrate provided by at least one embodiment of the present disclosure.

The specific process of the method for preparing the touch substrate according to an embodiment of the present disclosure will be described below with reference to FIG. 6A-FIG. 6D, FIG. 7-FIG. 10 and FIG. 11A.

Figure 6A:
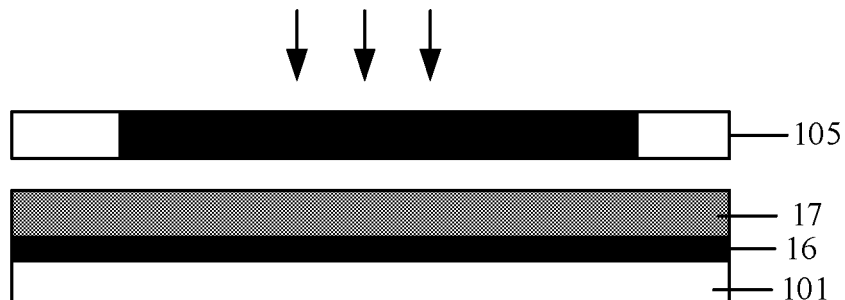
FIG. 6A-FIG. 6D, FIG. 7-FIG. 10 and FIG. 11A are schematic views of a method for preparing a display substrate provided by at least one embodiment of the present disclosure.
Figure 6B:
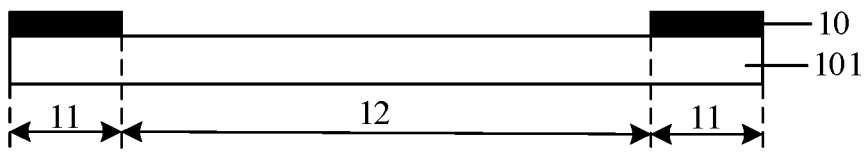

As illustrated in FIG. 6A-FIG. 6B, a substrate 101 is provided, a black matrix material layer 16 is formed on the base substrate 101, and a first photoresist 17 is formed on the black matrix material layer 16. The black matrix 10 is formed in a first region 11 on the base substrate 101 using a first mask 105 and the first photoresist 17. For example, the first region 11 is a non-working region located at an edge region of the display substrate.

Figure 6C:
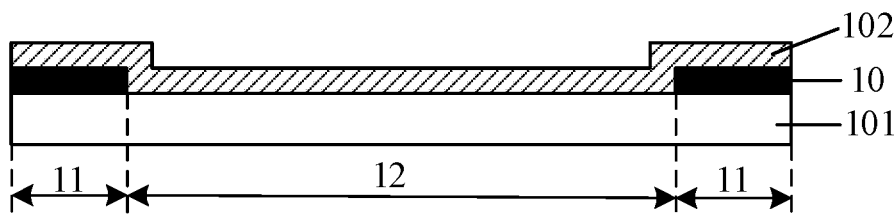

As illustrated in FIG. 6C, a functional material layer 102 is formed on the base substrate 101, for example, a material of the functional material layer 102 is a metal material. For example, the functional material layer 102 is formed by a deposition method, a sputtering method, a vapor deposition method, or the like. Of course, the material of the functional material layer 102 and the specific forming method can be selected according to the functional requirements of the structure to be formed by the functional material layer 102, and are not limited to the types listed above. For example, in other embodiments, the material of the functional material layer 102 may be other materials such as organic materials.

Figure 6D:
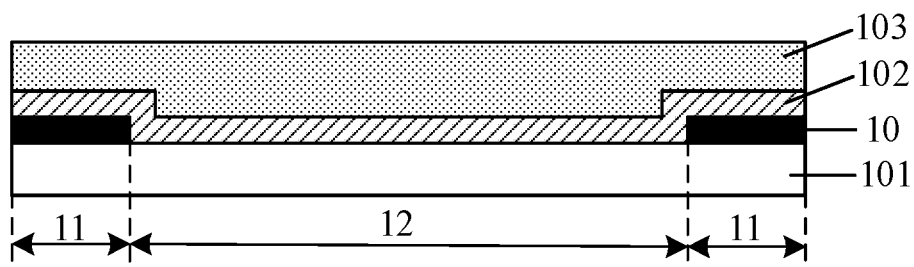

As illustrated in FIG. 6D, a second photoresist 103 is coated on the functional material layer 102.

Figure 7:
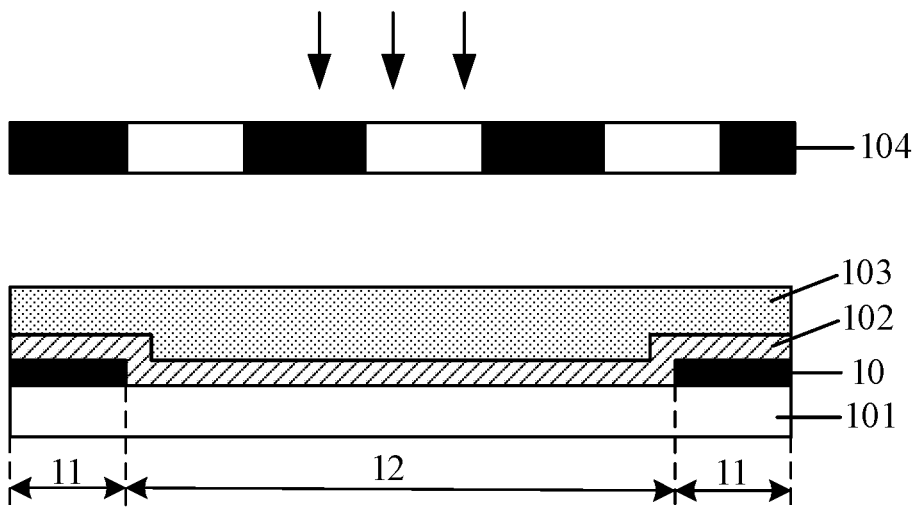

As illustrated in FIG. 7, a first exposure is performed on the second photoresist 103 using a second mask 104.

Figure 8:
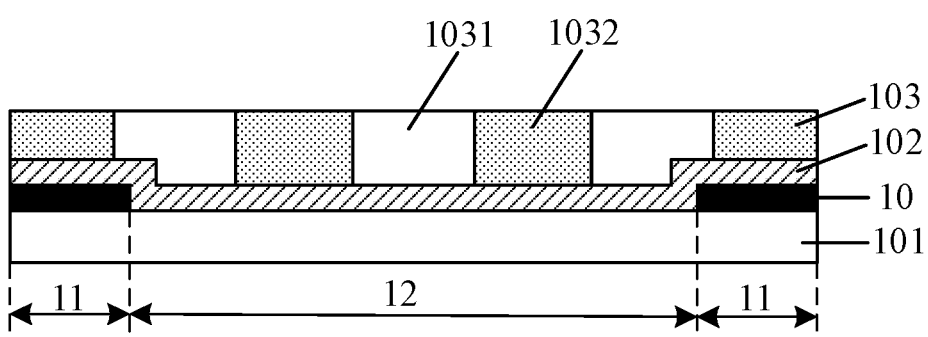

As illustrated in FIG. 8, a photosensitive region 1031 and anon-photosensitive region 1032 of the second photoresist 103 are obtained after the first exposure.

Figure 9:
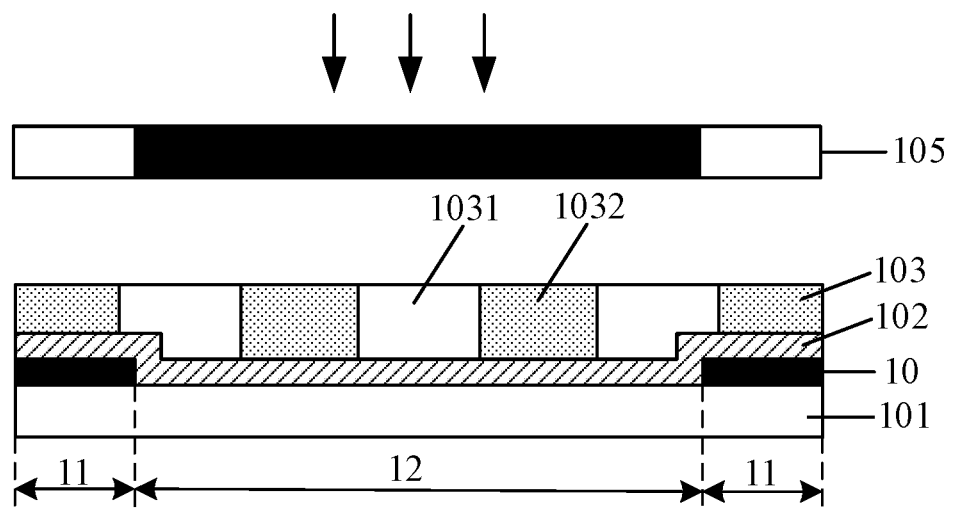

As illustrated in FIG. 9, a second exposure on the second photoresist 103 is performed using the first mask 105.

Figure 10:
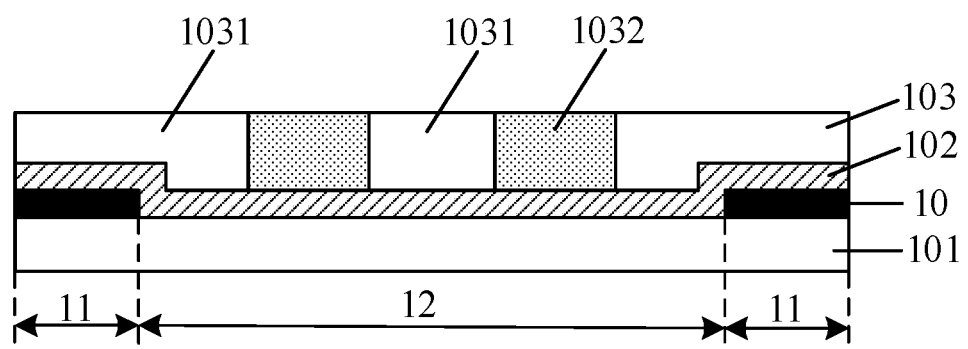

As illustrated in FIG. 10, the photosensitive region 1031 and the non-photosensitive region 1032 of the second photoresist 103 are obtained after the second exposure.

Figure 11A:
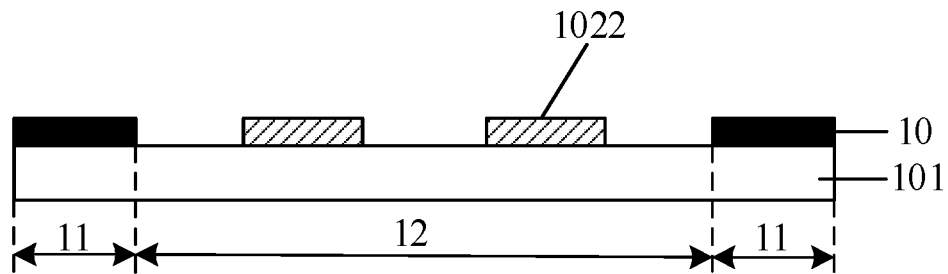

As illustrated in FIG. 11A, the second photoresist 103 after the first exposure and the second exposure is developed to form a photoresist pattern that exposes a part of the functional material layer 102, and the functional material layer 102 is etched using the photoresist pattern to form a functional layer 1022.

In the method for preparing the display substrate provided by at least one embodiment of the present disclosure, the first structure is formed on the base substrate by using the first mask, the first exposure is performed on the second photoresist using the second mask, the second exposure is performed on the second photoresist using the first mask, the second photoresist is developed after the first exposure and the second exposure to form the photoresist pattern, and the etching process is performed on the functional material layer using the photoresist pattern to form the functional layer. Compared with the prior art, the method provided by at least one embodiment of the present disclosure recycles the first mask when forming the functional layer, which reduces the production cost.

For example, in the above embodiment, the display substrate is a touch substrate, the second region 12 is a touch region, and the first region 11 is a non-touch region outside the touch region 12. The first structure 10 is a black matrix in the non-touch region and is used to protect touch electrodes in the touch region 12. For example, the second mask used for producing existing products has a pattern corresponding to the formation of the peripheral traces located in the non-touch region 11 and the functional layer 1022 located in the touch region 12. For example, the peripheral traces are circuit traces, such as wires for providing signals to touch electrodes or other traces, etc. The functional layer 1022 is a touch electrode or a connection bridge for connecting touch electrodes. By the etching process after the first exposure and the second exposure in this embodiment, the peripheral traces located in the non-touch region 11 is removed, and the pattern of the functional layer 1022 located in the touch region 12 is retained. Therefore, for products with different peripheral traces and bonding regions but the same touch region size, there is no need to redesign the mask, thus the utilization rate of the original mask is improved and the production and development cost is reduced. Subsequently, the peripheral traces can be formed by screen printing and other methods, thus not only the cost is saved, but also the technical implementation difficulty of touch substrate manufacturers is reduced when producing new products.

For example, the first photoresist is a negative photoresist and the second photoresist is a positive photoresist; alternatively, the first photoresist is a positive photoresist and the second photoresist is a negative photoresist.

In order to prevent the display substrate prepared in the embodiment of the present disclosure from being easily damaged, for example, after the functional layer 1022 is formed, the method for preparing the display substrate further includes forming a protection layer (not shown) covering the functional layer 1022 at a side, which is away from the base substrate 101, of the functional layer 1022, and the protection layer is used for protecting the functional layer 1022.

For example, a material of the protection layer includes at least one of an organic material, silicon oxide, silicon nitride, or silicon oxynitride. For example, a specific implementation is as follows: a $SiN_xO_y$ layer covering the functional layer 1022 is formed on the functional layer 1022 as a protection layer to protect the functional layer 1022. For example, the $SiN_xO_y$ layer is formed by a deposition method.

Of course, in other embodiments, for example, in a case where the material of the functional layer 1022 is an organic material, forming the protection layer includes the following steps.

First, a photoresist material layer covering the base substrate is formed at the side, which is away from the base substrate, of the functional material layer, for example, the photoresist material layer is formed by a coating method. For example, in a case where the first photoresist is the negative photoresist, the photoresist in the photoresist material layer is the positive photoresist; in a case where the first photoresist is the positive photoresist, the photoresist in the photoresist material layer is the negative photoresist.

Then, the photoresist material layer is patterned using the first mask to form the protection layer. For example, the first mask is used to expose the photoresist material layer, and finally, the exposed photoresist material layer is developed and etched to form the protection layer.

For example, in another embodiment of the present disclosure, the method for preparing the display substrate includes forming a second photoresist at a side, which is away from the base substrate, of the functional material layer; performing a first patterning process on the functional material layer using the second mask and the second photoresist to form a pre-functional layer, wherein the pre-functional layer comprises a portion located in the first region and a portion located in the second region; forming a third photoresist at a side, which is away from the base substrate, of the pre-functional layer; and performing a second patterning process on the pre-functional layer using the first mask and the third photoresist to remove the portion of the pre-functional layer located in the first region and retain the portion of the pre-functional layer located in the second region as the functional layer.

Illustratively, FIG. 11B-FIG. 11E are schematic diagrams of another method for preparing a display substrate provided by at least one embodiment of the present disclosure.

Figure 11B:
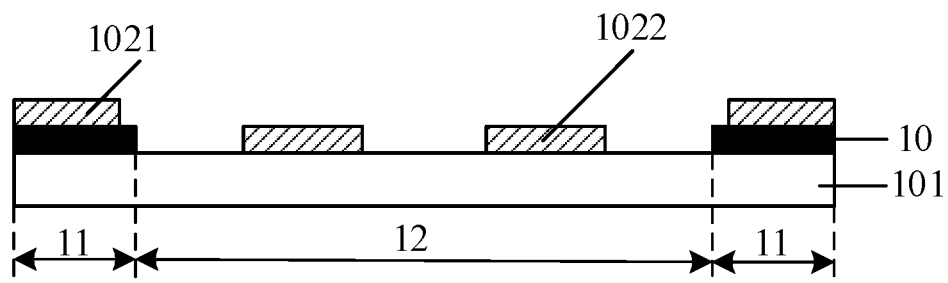
FIG. 11B-FIG. 11E are schematic diagrams of another method for preparing a display substrate provided by at least one embodiment of the present disclosure.

As illustrated in FIG. 11B, after the steps illustrated in FIG. 6A-FIG. 6D and FIG. 7-FIG. 8 are completed, that is, after performing the second exposure using the above-mentioned second mask, a first patterning process is performed on the functional material layer to form a pre-functional layer; the pre-functional layer includes a portion 1021 in the first region and a portion 1022 in the second region.

Figure 11C:
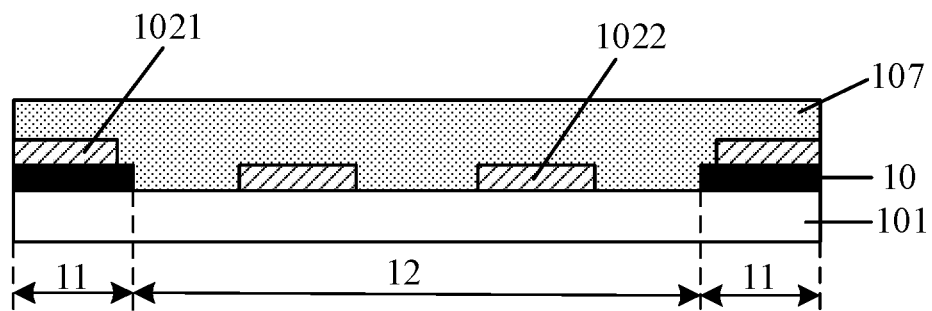
Figure 11D:
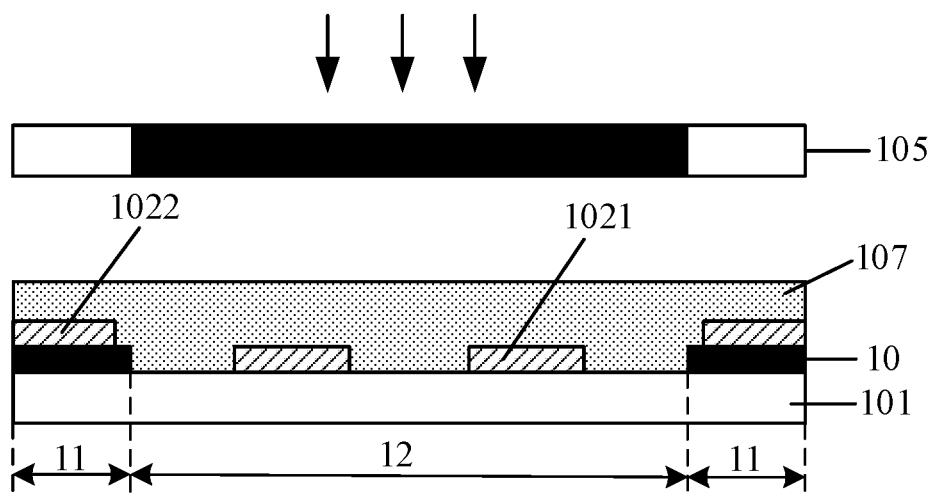
Figure 11E:
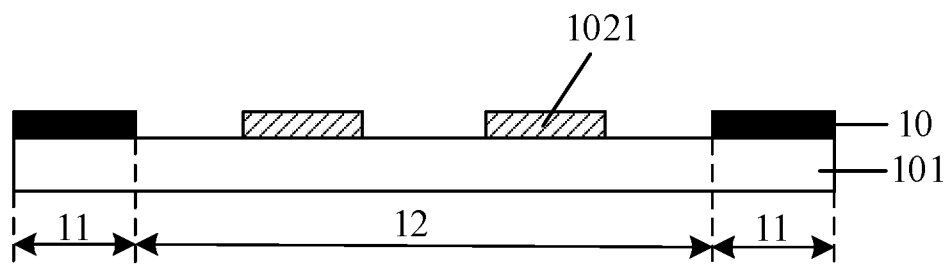

As illustrated in FIG. 11C, a third photoresist 107 is formed at a side, which is away from the base substrate 101, of the pre-functional layer.

As illustrated in FIG. 12D, the pre-functional layer is exposed using the first mask and the third photoresist 107. Then, as illustrated in FIG. 12E, an etching process is performed on the pre-functional layer to remove the portion 1021 of the pre-functional layer in the first region and retain the portion 1022 of the pre-functional layer in the second region as the functional layer.

This embodiment achieves a similar technical effect to the method for preparing the display substrate provided in the previous embodiment. Other features not mentioned are the same as those in the previous embodiment, please refer to the previous description.

FIG. 12 to FIG. 16 are schematic plan views of a display substrate provided by an embodiment of the present disclosure. For example, in this embodiment, the display substrate is a touch substrate, the second region is a touch region, and the first region is a non-touch region located outside the touch region; the first structure is a black matrix located in the non-touch region. According to the touch control substrate prepared by at least one embodiment of the disclosure, the peripheral traces are removed, and patterns of the touch region or the display region are retained. Subsequently, the positions of the peripheral traces and the bonding region can be prepared according to different design requirements of each product by the screen printing process and the FPC (Flexible Printed Circuit Board, flexible printed circuit board) wiring process, etc.

For example, the method includes the following steps.

Step 1: forming a black matrix (BM) layer, that is, the above-mentioned first structure, on the edge region of the base substrate using the first mask.

Figure 12:
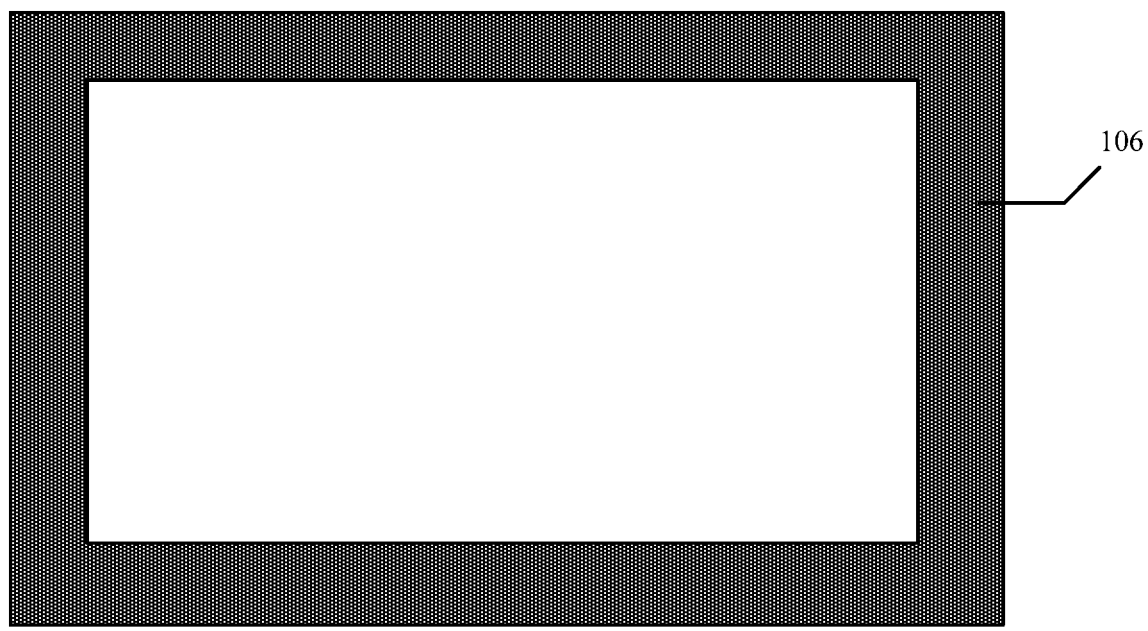
FIG. 12 to FIG. 16 are schematic plan views of a method for preparing a display substrate provided by at least one embodiment of the present disclosure.

For example, the black matrix material layer is coated on the entire surface of the base substrate, for example, the black matrix material layer is a BM photoresist, the BM photoresist is exposed with the first mask, and then the BM photoresist is developed and a part of the BM photoresist in the non-photosensitive region is peeled off to finally form a panel frame region 106, as illustrated in FIG. 12, the manufacturing process corresponds to the step 1 above.

Step 2: forming a first touch electrode and a second touch electrode in the touch region.

Figure 13:
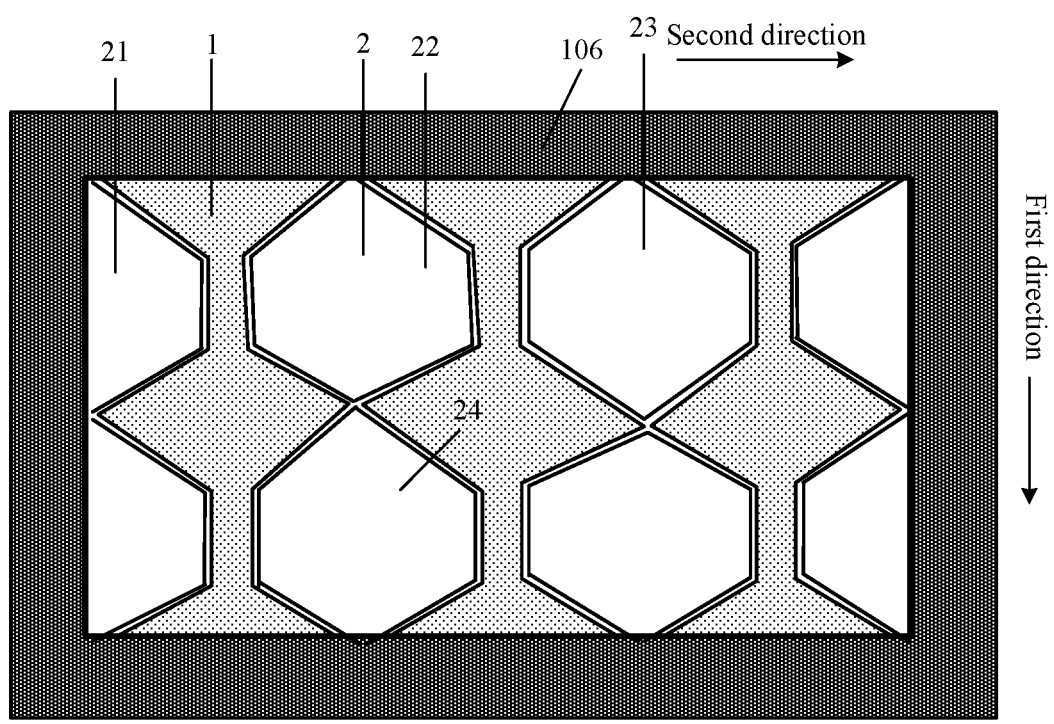

For example, a touch electrode material layer is evaporated on the entire surface of the base substrate, a photo resist (PR) is coated on a surface of the touch electrode material layer, the photo resist is exposed using a customized touch electrode mask, then a development reaction is carried out, the touch electrode material layer after being exposed is etched, and a non-photosensitive part of the photo resist is removed to finally form a first touch electrode 1 and a second touch electrode 2, as illustrated in FIG. 13, the first touch electrode 1 and the second touch electrode 2 are in a same layer and are spaced apart with each other to be insulated from each other. The first touch electrode 1 extends in a first direction, the second touch electrode 2 extends in a second direction and comprises two portions 21/22 spaced apart from each other by the first touch electrode 1. The first touch electrode 1 includes a plurality of portions extending in the first direction; the second touch electrode 2 includes a plurality of rows arranged in the second direction and a plurality of columns arranged in the first direction; each of the plurality of rows includes a plurality of portions 21/22/23 spaced apart by the first touch electrode 1, and each of the plurality of columns includes a plurality of portions 22/24 spaced apart from each other.

For example, materials of the first touch electrode 1 and the second touch electrode 2 are transparent conductive materials (for example, ITO) or metal materials (for example, copper, aluminum, copper alloy, aluminum alloy, etc.).

Figure 14:
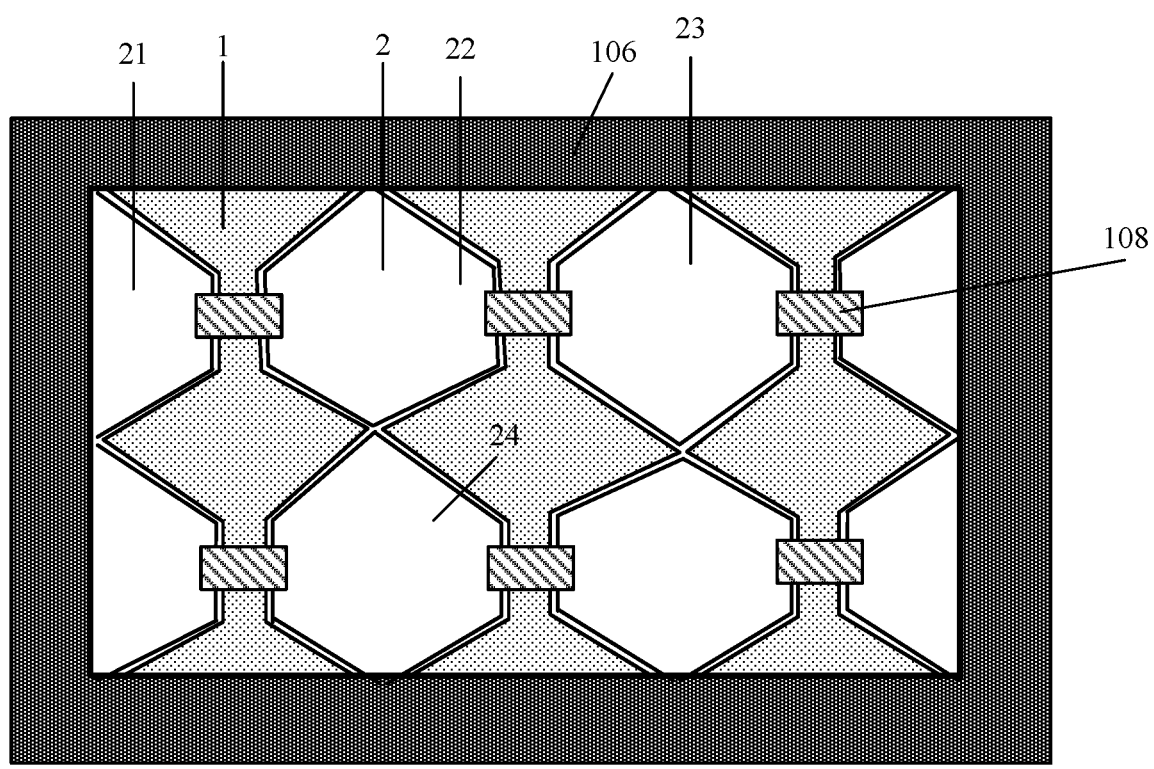

Step 3: forming an insulating layer 108; for example, the insulating layer 108 includes a plurality of portions that respectively connect adjacent portions in each of the plurality of rows of the second touch electrode, as illustrated in FIG. 14.

Figure 15:
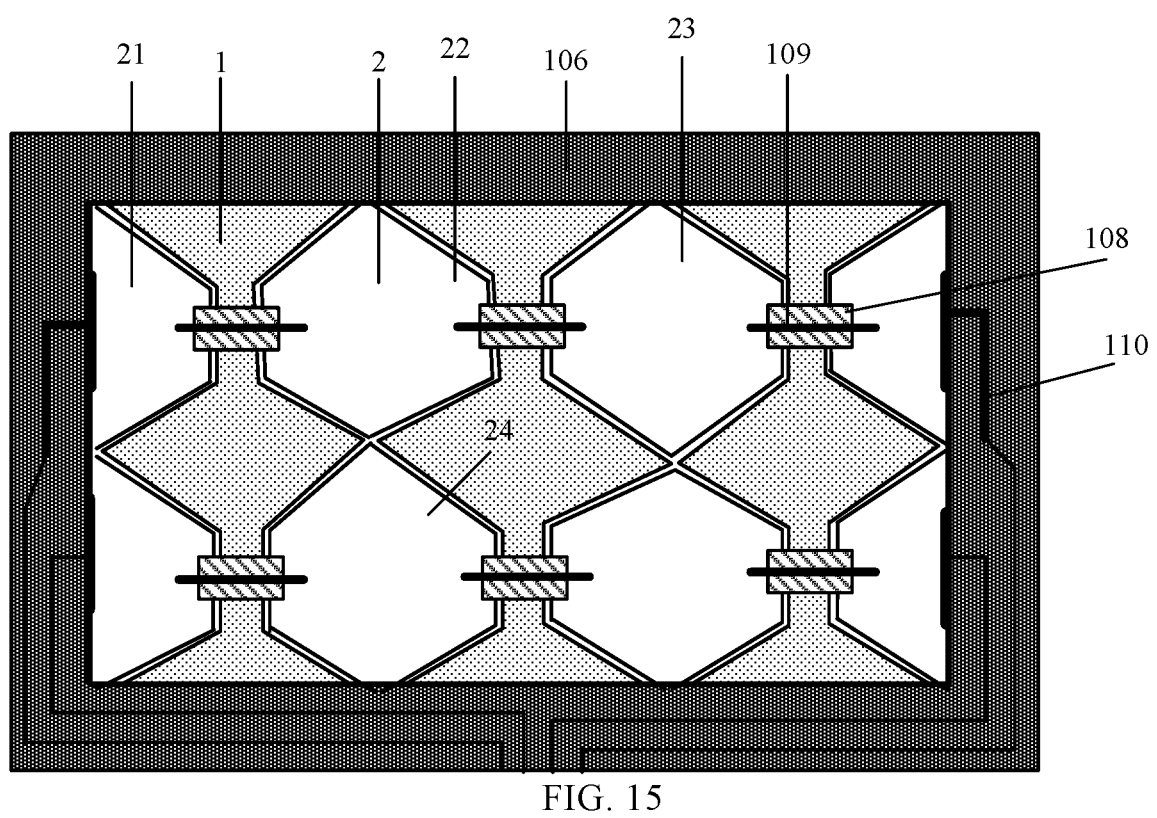

Step 4: forming a connection bridge electrically connecting the two portions of the second touch electrode. For example, in a case where the first touch electrode includes the plurality of portions, the connection bridge includes a plurality portions respectively electrically connecting the plurality of portions in each of the plurality of rows of the second touch electrode to each other. As illustrated in FIG. 15, for example, the connection bridge 109 includes a plurality of portions that electrically connect adjacent portions in each of the plurality of rows of the second touch electrode 2 respectively across the plurality of portions of the insulating layer 108. Therefore, the insulating layer 108 is between the connection bridge 109 and the first touch electrode 1 to insulate the connection bridge 109 from the first touch electrode 1.

For example, the above-mentioned functional material layer covering the entire base substrate is formed, and the functional material layer is patterned using the second mask to form the connection bridge 109 and the peripheral traces 110 in the second region. That is, the above functional layer is the connection bridge 109, and the above pre-functional layer includes the connection bridge 109 and the peripheral traces 110.

Figure 16:
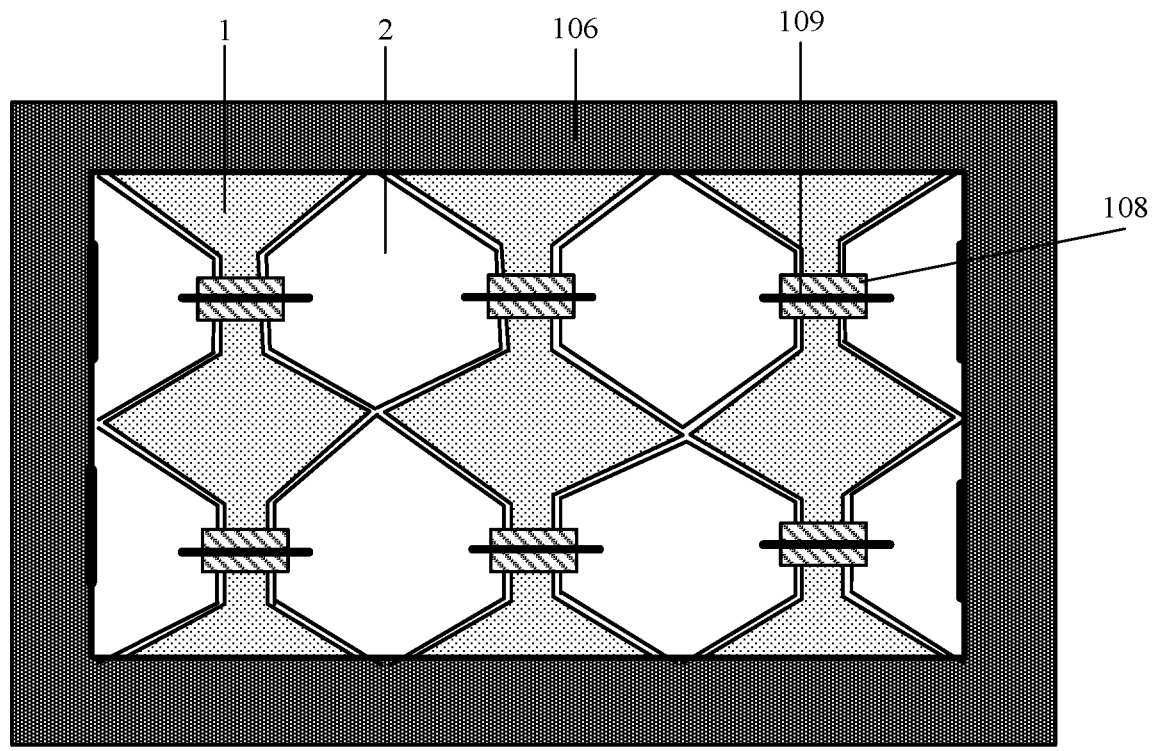

For example, a material of the functional material layer is a metal material, so that the material of the connection bridge 109 and the peripheral traces 110 is the metal material. Then, the second exposure is performed on using the first mask, and then the photoresist after the first exposure and the second exposure is developed to expose a part of the functional material layer, and then the functional material layer is etched to remove the peripheral traces 110 to form the functional layer, as illustrated in FIG. 16.

Step 5: forming a protection layer (not shown) covering the functional layer on the functional layer, and the protection layer is used for protecting the functional layer.

For example, a SiNxOy layer covering the functional layer is formed on the functional layer as the protection layer.

The innovation of this embodiment is that when exposing the metal layer, the existing technical scheme needs to customize or modify the mask to realize change of the peripheral traces, but the cost is high. However, in this embodiment, the metal layer is exposed twice to form a connection bridge, and the peripheral traces are etched to form a semi-finished touch screen.

Of course, in other embodiments, the functional layer may also be a touch electrode, such as the first touch electrode and the second touch electrode. For example, in a case where the material of the first touch electrode and the second touch electrode is the metal material, the touch electrode material layer is patterned using the second mask to form the first touch electrode and the second touch electrode in the touch region (the second region) and the peripheral traces in the non-touch region (the first region).

For example, the protection layer is formed by the patterning process using the first mask. For example, in a case where the material of the functional layer 1022 is an organic material, forming the protection layer includes the following steps. Firstly, the photoresist material layer covering the base substrate is formed on the functional layer, for example, the photoresist material layer is formed by the coating method. For example, in a case where the first photoresist is the negative photoresist, the photoresist in the photoresist material layer is the positive photoresist; in a case where the first photoresist is the positive photoresist, the photoresist in the photoresist material layer is the negative photoresist.

Then, the photoresist material layer is patterned using the first mask to form the protection layer. For example, the first mask is used to expose the photoresist material layer, and finally, the photoresist material layer after being exposed is developed and etched to form the protection layer. The protection layer covers the touch region so as to protect the electrodes in the touch region.

At least one embodiment of the present disclosure further provides a display substrate including a base substrate, a first structure and a functional layer. The base substrate includes a first region and a second region; the first structure is in the first region; the functional layer is in the second region; no layer in a same layer with the functional layer or made of a same material as the functional layer is in the first region. The functional layer is prepared according to any method for preparing the display substrate provided by at least one embodiment of the disclosure. The display substrate provided by the embodiment of the present disclosure can be produced in batch. When a new product is developed, in a case where the pattern in the first region needs to be changed without changing the pattern of the functional layer in the second region, the display substrate provided by the embodiment of the present disclosure can be manufactured by a method such as the screen printing process and the FPC (Flexible Printed Circuit Board) routing process, etc. to form the required pattern in the first region without designing a special mask for forming the specific pattern for the new pattern in the first region in the process of producing the display substrate, thus not only the cost is saved, but also the technical implementation difficulty of the display substrate manufacturers is reduced when producing new products.

For example, the display substrate is a touch substrate. The second region is a touch region, and the first region is a non-touch region located outside the touch region; the first structure is a black matrix located in the non-touch region.

For example, the display substrate provided by an embodiment of the present disclosure further includes a first touch electrode, a second touch electrode and a connection bridge. The first touch electrode and the second touch electrode are in the touch region, and the first touch electrode and the second touch electrode are in a same layer and insulated from each other; the first touch electrode extends in a first direction, the second touch electrode extends in a second direction and comprises two portions spaced apart from each other by the first touch electrode; the connection bridge electrically connecting the two portions of the second touch electrode. For example, the first touch electrode includes a plurality of portions extending in a first direction; the second touch electrode includes a plurality of rows arranged in a second direction and a plurality of columns arranged in the first direction; the first direction is cross with the second direction. For example, each of the plurality of rows includes a plurality of portions spaced apart by the first touch electrode, and each of the plurality of columns includes a plurality of portions spaced apart from each other; the connection bridge electrically connects the plurality of portions in each of the plurality of rows of the second touch electrode to each other; for example, the functional layer is the connection bridge.

Of course, in other embodiments, the functional layer may also be a touch electrode, which includes, for example, a first touch electrode and a second touch electrode.

The specific features of the display substrate provided by at least one embodiment of the present disclosure are described in the previous embodiment of the method for preparing the display substrate, and no repetition is given here.

At least one embodiment of the present disclosure further provides a display device, and the display device includes any one of the display substrates provided by the embodiments of the present disclosure.

Figure 17:
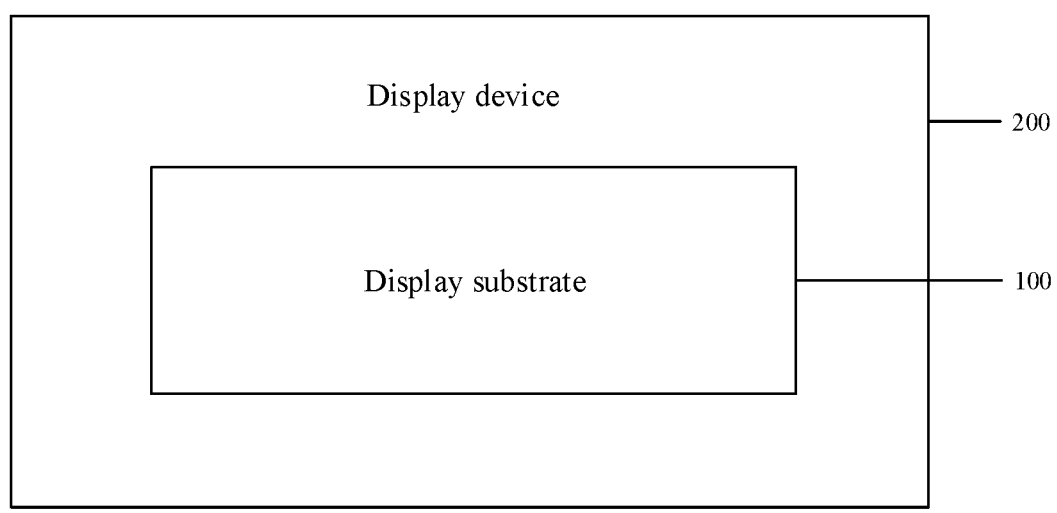
FIG. 17 is a schematic diagram of a display device provided by at least one embodiment of the present disclosure.

FIG. 17 is a schematic diagram of a display device provided by at least one embodiment of the present disclosure. As illustrated in FIG. 17, a display device 200 includes any of the display substrates 100 provided by the embodiments of the present disclosure. For example, in a case where the display substrate 100 is a touch substrate, the display device 200 is a touch display device.

For example, the display device 200 is any product or component having a display function such as a mobile phone, a tablet computer, a television, a display, a notebook computer, a digital photo frame, a navigator etc.

Other essential components of the display device should be understood by those of ordinary skill in the art and will not be described here.

What have been described above are only specific implementations of the present disclosure, the protection scope of the present disclosure is not limited thereto. The protection scope of the present disclosure should be based on the protection scope of the claims.

What is claimed is:
1. A method for preparing a display substrate, comprising:
providing a base substrate, wherein the base substrate comprises a first region and a second region;
forming a first structure in the first region using a first mask and a first photoresist;
forming a functional material layer at a side, which is away from the base substrate, of the first structure; and
patterning the functional material layer using a second mask and the first mask to form a functional layer in the second region, the patterning the functional material layer comprising:
forming a second photoresist at a side, which is away from the base substrate, of the functional material layer;
performing a first exposure on the second photoresist using the second mask;
performing a second exposure on the second photoresist using the first mask;

developing the second photoresist after the first exposure and the second exposure to form a photoresist pattern; and performing an etching process on the functional material layer using the photoresist pattern.

2. The method for preparing the display substrate according to claim 1, wherein
the first photoresist is a negative photoresist and the second photoresist is a positive photoresist; or
the first photoresist is the positive photoresist and the second photoresist is the negative photoresist.

3. The method for preparing the display substrate according to claim 1, wherein
the display substrate is a touch substrate, the second region is a touch region, and the first region is a non-touch region outside of the touch region; and
the first structure is a black matrix in the non-touch region.

4. The method for preparing the display substrate according to claim 3, comprising:
forming a first touch electrode and a second touch electrode in the touch region, wherein the first touch electrode and the second touch electrode are in a same layer and insulated from each other, the first touch electrode extends in a first direction, the second touch electrode extends in a second direction and comprises two portions spaced apart from each other by the first touch electrode; and
forming a connection bridge electrically connecting the two portions of the second touch electrode wherein the functional layer is the connection bridge.

5. The method for preparing the display substrate according to claim 1, wherein the functional layer is a touch electrode.

6. The method for preparing the display substrate according to claim 1, wherein a material of the functional material layer is a metal material.

7. The method for preparing the display substrate according to claim 4, further comprising:
forming an insulating layer, wherein the insulating layer is located between the connection bridge and the first touch electrode to insulate the connection bridge from the first touch electrode.

8. The method for preparing the display substrate according to claim 1, further comprising:
forming a protection layer covering the functional layer at a side, which is away from the base substrate, of the functional layer.

9. The method for manufacturing the display substrate according to claim 8, wherein a material of the protection layer comprises at least one of an organic material, silicon oxide, silicon nitride or silicon oxynitride.

10. The method for preparing the display substrate according to claim 9, wherein the forming the protection layer covering the functional layer comprises:
forming a photoresist material layer covering the base substrate at a side, which is away from the base substrate, of the functional layer; and
patterning the photoresist material layer using the first mask to form the protection layer.

11. The method for preparing the display substrate according to claim 10, wherein
the first photoresist is a negative photoresist and a photoresist in the photoresist material layer is a positive photoresist; or
the first photoresist is the positive photoresist and the photoresist in the photoresist material layer is the negative photoresist.

12. A method for preparing a display substrate, comprising:
providing a base substrate, wherein the base substrate comprises a first region and a second region;
forming a first structure in the first region using a first mask and a first photoresist;
forming a functional material layer at a side, which is away from the base substrate, of the first structure; and
patterning the functional material layer using a second mask and the first mask to form a functional layer in the second region, the patterning the functional material layer comprising:
forming a second photoresist at a side, which is away from the base substrate, of the functional material layer;
performing a first patterning process on the functional material layer using the second mask and the second photoresist to form a pre-functional layer, wherein the pre-functional layer comprises a portion in the first region and a portion in the second region;
forming a third photoresist at a side, which is away from the base substrate, of the pre-functional layer; and
performing a second patterning process on the pre-functional layer using the first mask and the third photoresist to remove the portion of the pre-functional layer located in the first region and retain the portion of the pre-functional layer located in the second region as the functional layer.

13. The method for preparing the display substrate according to claim 12, wherein the portion of the pre-functional layer located in the first region is a circuit trace.

14. The method for preparing the display substrate according to claim 12, wherein
the first photoresist is a negative photoresist and the second photoresist is a positive photoresist; or
the first photoresist is the positive photoresist and the second photoresist is the negative photoresist.

15. The method for preparing the display substrate according to claim 12, wherein
the display substrate is a touch substrate, the second region is a touch region, and the first region is a non-touch region outside of the touch region; and
the first structure is a black matrix in the non-touch region.

16. The method for preparing the display substrate according to claim 15, comprising:
forming a first touch electrode and a second touch electrode in the touch region, wherein the first touch electrode and the second touch electrode are in a same layer and insulated from each other, the first touch electrode extends in a first direction, the second touch electrode extends in a second direction and comprises two portions spaced apart from each other by the first touch electrode; and
forming a connection bridge electrically connecting the two portions of the second touch electrode,
wherein the functional layer is the connection bridge.

17. The method for preparing the display substrate according to claim 12, wherein the functional layer is a touch electrode.

18. The method for preparing the display substrate according to claim 12, further comprising:

forming a protection layer covering the functional layer at a side, which is away from the base substrate, of the functional layer.

19. A method for preparing a display substrate, comprising:
providing a base substrate, wherein the base substrate comprises a first region and a second region;
forming a first structure in the first region using a first mask and a first photoresist;
forming a functional material layer at a side, which is away from the base substrate, of the first structure;
patterning the functional material layer using a second mask and the first mask to form a functional layer in the second region; and
forming a protection layer covering the functional layer at a side, which is away from the base substrate, of the functional layer,
wherein the forming the protection layer covering the functional layer comprises:
  forming a photoresist material layer covering the base substrate at a side, which is away from the base substrate, of the functional layer; and
  patterning the photoresist material layer using the first mask to form the protection layer.

20. The method for preparing the display substrate according to claim 19, wherein
the first photoresist is a negative photoresist and a photoresist in the photoresist material layer is a positive photoresist; or
the first photoresist is the positive photoresist and the photoresist in the photoresist material layer is the negative photoresist.

* * * * *